United States Patent
Kessenich et al.

(10) Patent No.: US 6,684,173 B2
(45) Date of Patent: Jan. 27, 2004

(54) SYSTEM AND METHOD OF TESTING NON-VOLATILE MEMORY CELLS

(75) Inventors: Jeffrey Alan Kessenich, Boise, ID (US); Andrei Mihnea, Boise, ID (US); Devin Batutis, Campbell, CA (US)

(73) Assignee: Micron Technology, Inc., Boise, ID (US)

( * ) Notice: Subject to any disclaimer, the term of this patent is extended or adjusted under 35 U.S.C. 154(b) by 137 days.

(21) Appl. No.: 09/973,527

(22) Filed: Oct. 9, 2001

(65) Prior Publication Data

US 2003/0074152 A1 Apr. 17, 2003

(51) Int. Cl.[7] .............................................. G06F 19/00
(52) U.S. Cl. ........................... 702/117; 702/58; 702/81; 702/189; 365/189.01; 365/189.07; 365/189.09; 365/189.11; 714/774; 714/799; 711/102; 711/103; 324/76.61; 324/211
(58) Field of Search ............................... 702/35, 57–59, 702/64, 65, 80, 81, 108, 117, 118, 120, 122, 124, 126, 183, 185, 189, FOR 103, 104, 106, 134, 135, 170, 171; 365/189.01, 189.07, 189.09, 189.11; 714/798, 763, 774; 324/211, 76.61; 711/102, 103; 712/14, 37

(56) References Cited

U.S. PATENT DOCUMENTS

| | | | | |
|---|---|---|---|---|
| 4,779,272 A | * | 10/1988 | Kohda et al. | ................ 365/189 |
| 5,699,298 A | * | 12/1997 | Shiau et al. | ........... 365/185.18 |
| 5,712,816 A | | 1/1998 | Cappelletti et al. | |
| 5,793,675 A | | 8/1998 | Cappelletti et al. | |
| 5,864,501 A | | 1/1999 | Lee | |
| 5,909,397 A | * | 6/1999 | San et al. | .............. 365/185.24 |
| 6,538,937 B2 | * | 3/2003 | Hashidzume et al. | ....... 365/201 |
| 2002/0018365 A1 | * | 2/2002 | Yoshimura | ............. 365/185.09 |

OTHER PUBLICATIONS

Sweetman, Reliability of Reprogrammable Nonvolatile Memories Jan. 1998, Vol: 4518, pp. 101–108.*

* cited by examiner

*Primary Examiner*—Patrick Assouad
*Assistant Examiner*—Elias Desta
(74) *Attorney, Agent, or Firm*—Leffert Jay & Polglaze, P.A.

(57) ABSTRACT

The present invention provides a screen for abnormal cells using the cell transconductance. In one embodiment, a method involves reading cells against an elevated reference current while applying an elevated gate voltage, or alternatively, reading all cells against a standard reference current while applying a nominal or elevated gate voltage, and a reduced drain voltage. The abnormal cells fail this test while normal cells pass.

23 Claims, 6 Drawing Sheets

SYSTEM AND METHOD OF TESTING NON-VOLATILE MEMORY CELLS

FIELD OF THE INVENTION

The present invention relates generally to non-volatile memory devices and in particular the present invention relates to floating gate memory cells.

BACKGROUND OF THE INVENTION

One class of integrated circuits contains floating-gate memory devices that utilize electron tunneling to either add electrons to, or remove electrons from, the floating gates. In other words, electron tunneling is employed to either program and/or erase those cells. Such ICs are often called EEPROMs, flash EPROMs, or non-volatile RAMS. Floating gate cells which rely on tunneling may also be used in other types of integrated circuits as well.

One predominant reliability failure mechanism has plagued floating gate devices in the past. This is the inability of the memory cell to continue to program and erase (typically referred to on an EPROM type device as "cycling" or "endurance"). An IC failing after a given cycling operation is frequently referred to as suffering an "endurance failure". Note that the term "reliability" as used in this context, refers to the probability that an IC will perform a required function for a stated period of time. Common causes of cycling failure include rupture of the tunneling oxide, excessive electron/hole trapping in the tunneling oxide, ion contamination or failure of the conductive circuit elements (made of metal, semiconductor or contact between the two) to the sensing circuitry located outside the memory array.

In the past, once a floating-gate circuit has been completely fabricated, there has no been a way of predicting how many cycles that part may endure before failing to erase or program. Consequently, manufacturers have had to implement elaborate screening procedures to eliminate those devices that are destined to fail within a relatively short period of time. The traditional method of screening dielectric breakdown endurance failures involves extensive program/erase cycling of the ICs. The devices in question, or a statistical sample of them, are cycled many times and then tested for proper functionality. This type of screening generally involves discarding the failed ICs. Alternatively, the IC may be repaired using redundant circuitry that can be switched in to replace defective circuit elements. Lot/acceptance criteria may also be used so that an entire lot of wafers may be rejected based upon the percent fail in the cycling screen or some other measure of endurance of the lot or the samples taken from it.

See "Method of screening EPROM-related devices for endurance failure", U.S. Pat. No. 4,963,825 issued Oct. 16, 1990 for a method for screening EPROM-related integrated circuits for endurance failures. The screening method is based on a measurement of the number and distribution of cells within the EPROM-related device which program and/or erase significantly further and faster than "normal" cells.

Standard abnormal memory cell screens involve either limiting the number or program or erase pulses allowed for the cells to achieve a programmed or erased state or fully or partially programming/erasing the cells and then screening for cells outside an acceptable Vt distribution, as described above. In both cases, all cells are biased during program/erase verification with nominal drain voltage and compared for cell current (Ids) against a reference cell that is slightly above (programmed Vt) or below (erased Vt) the nominal read reference cell Vt by a few $\mu A$.

Endurance cycling of memory cells has shown that cells, which pass traditional screening tests, can intermittently fail to erase. Additionally, test data has shown that cells that pass this test may intermittently fail repeated or long reads.

For the reasons stated above, and for other reasons stated below which will become apparent to those skilled in the art upon reading and understanding the present specification, there is a need in the art for improved testing procedures to identify problem memory cells.

SUMMARY OF THE INVENTION

The above-mentioned problems with non-volatile memory cells and other problems are addressed by the present invention and will be understood by reading and studying the following specification.

In one embodiment, a method of testing a non-volatile floating gate memory cell comprises placing the memory cell in a low threshold voltage, Vt, state, applying a normal read level drain voltage to a drain of the memory cell, applying an elevated gate voltage to a control gate of the memory cell, and comparing a drain current of the memory cell to a reference drain current. The memory cell is determined to be defective if the drain current is below the reference current.

In another embodiment, a method of testing a non-volatile floating gate memory cell comprises placing the memory cell in a low threshold voltage, Vt, state, applying a reduced drain voltage to a drain of the memory cell, and applying a nominal or elevated gate voltage to a control gate of the memory cell. A drain current of the memory cell is compared to a reference drain current, wherein the memory cell is determined to be defective if the drain current is below the reference current.

A method of testing a non-volatile floating gate memory cell comprises placing the memory cell in a low threshold voltage, Vt, state, applying a drain voltage in the range of 0.5 to 2.5 volts to a drain of the memory cell, and applying a gate voltage in the range of 2.0 to 12 volts to a control gate of the memory cell. A drain current of the memory cell is compared to a reference drain current in the range of $10\ \mu A$ to $200\ \mu A$, wherein the memory cell is determined to be defective if the drain current is below the reference current.

A method of testing a non-volatile floating gate memory cell comprises placing the memory cell in a low threshold voltage, Vt, state, applying a drain voltage in the range of 0.1 to 1.0 volts to a drain of the memory cell, and applying a gate voltage in the range of 0.0 to 12 volts to a control gate of the memory cell. A drain current of the memory cell is compared to a reference drain current in the range of $1\ \mu A$ to $100\ \mu A$, wherein the memory cell is determined to be defective if the drain current is below the reference current.

DETAILED DESCRIPTION OF THE DRAWINGS

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Abnormal memory cells are traditionally detected and screened when the abnormal cell threshold voltage, Vt, is outside of a normal distribution for programmed or erased cell Vt. Such standard tests cannot detect all types of abnormalities that can lead to failure during subsequent erase, program, or read operations. The present invention provides a method of screening for abnormal cells using two characteristics of many abnormal cells, namely increased cell resistance and decreased transconductance. In one embodiment, a method involves reading cells against an elevated reference current while applying an elevated gate voltage, or alternatively, reading all cells against a standard reference current while applying a nominal or elevated gate voltage, and a reduced drain voltage. The abnormal cells fail this test while normal cells pass.

The method of this disclosure involves a different cell bias and test scheme which checks for a minimum transconductance of each cell to ensure that each cell has a comparable transconductance to that of reference cell(s). This method improves the reliability of a memory part by ensuring that memory cells have sufficient transconductance to allow accurate sensing of each cell's Vt against any reference current level. This allows consistent programming/erasure. The method also tracks the drain current and voltage characteristics of the reference cell so that guard bands built into the erase and programming algorithms allow accurate sensing of memory cells during a subsequent read. Prior to describing the present invention in more detail, a description of a floating gate memory cell and memory are provided.

Slow floating gate memory cells can be the major source of cycling failures when testing memory devices. Cells that are slow to erase can cause an over-erase condition on array blocks and result in a large number of current leaky columns. This results in either program verify failures on the next cycle due to excessive column current, or read logic one failures due to defective cells passing erase verify on column current alone and becoming logic zero again after column current is repaired by soft programming. Slow programming cells can also cause timeout failures during programming. The main causes of both can be resistive drain contacts (typically polymer or other contamination at the base of the contact), a blocked source/drain implant, or a deformed polysilicon gate material causing abnormal cell capacitive coupling.

Several tests are currently implemented to screen for slow cells. For slow to program cells, the number of programming pulses applied is limited. For erase, both a partial erase plus a margin verify read at high Vg is performed and a repeating bit count at erase verify is used to find outlying slow to erase cells. Although these screens have been very successful at screening out defective cells, these screens do have limitations. For instance, chip erase during die probe can not always catch defective cells if there is a mismatch between erase speeds of the individual array blocks. A fast erasing cell on the same column as a slow erasing cell may cause the slow cell to pass erase verify prematurely due to column current generated from depletion of the faster erasing cell. This can lead to a perceived logic one disturb problem after soft programming or compaction repairs the depleted cell. Additionally, some parts have been observed to be unstable and intermittently pass and fail the probe screens. Only when defective cells are sufficiently outside a normal erase Vt distribution can they be detected without risk of test overkill.

The primary cause of unreliable intermittent slow to erase Flash cells has been related to unstable, varying resistance contacts. Such defects are not fully detectable with existing manufacturing screens. Taking advantage of a common characteristic of such failures, namely a greatly reduced transconductance compared with normal cells, a screen has been developed to detect such cells during the manufacturing flow. A high gate voltage margin read of parts in an ultraviolet (UV) or electrical erase state along with an elevated drain reference current provides a repeatable means of detecting such defective cells. This test is effective even in a lowered contact resistance state (passing cycling condition), as the defective cells cannot achieve sufficient Ids to pass the test.

Figure 2:
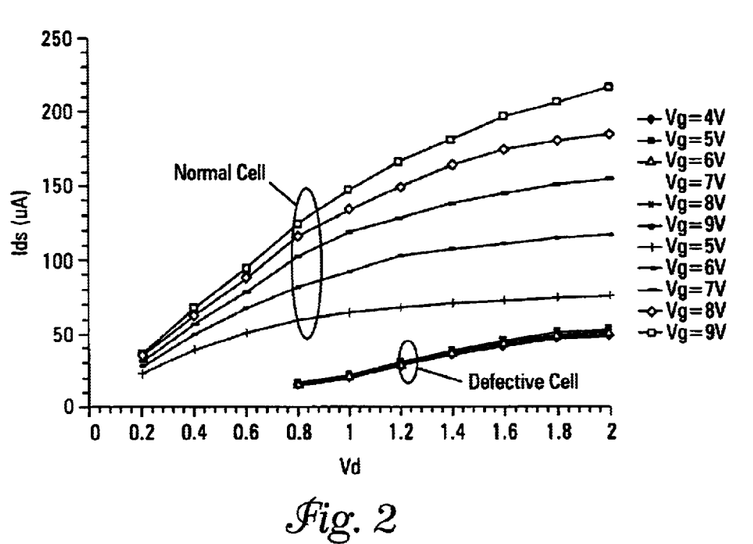
FIG. 2 illustrates drain current and drain voltage plots of a normal floating gate memory cell and a defective memory cell.

Evaluation of slow erasing cells consistently shows highly resistive cells with little to no gate modulation of Ids (see FIG. 2). Such parts fail cycling because the defective cells cannot be erased sufficiently to provide an Ids that is greater than the erase verify current reference. As a result, array blocks are typically over-erased to deplete normal cells until the defective cell Ids and the column current from depleted normal cells was greater than the erase verify current reference. Sometimes the memory may never reach this point before the maximum possible erase pulses are used up. Other times the erase appears successful but the high column current that is generated in such cases is unrecoverable and the part fails a subsequent program verify operation.

A subset of the slow erasing cells has been found to be intermittent. Usually these cells come in pairs and share a drain contact. Ids on the pair of cells vary from one cycle to the next and sometimes such cells cycle normally with no excess column current generated, while at other times the cells would fail cycling. In the past, the slow erase bit screens that were implemented at probe caught most of the intermittent cells and the subsequent failure rate was acceptable. As the population of memory cells increase, contamination at the contact plug results in defective cells. Minor, undetectable contamination during the fabrication process may lead to insufficient adhesion/bonding of the metals at the top/bottom of the contact plug, or insufficient Ti-silicide formation at the bottom of the contact plug. With mechanical stresses produced from thermal expansion and contraction during various manufacturing process, or by heating of the contact from current flow during cell programming, the weak contact area may separate (come together) and contact resistance increase (decrease).

The defective cells do not produce column current within the array block during erase operations. This is a concern because when the defective cells exhibit such an intermediate contact resistance, the cells may pass cycling, pass existing slow bit screens, and are hidden within a normal looking Vt distribution of erased cells. No prior methods exist to screen out such defective cells. One common characteristic of these defective contact cells is that even as Ids varies with cycling, the contact resistance is sufficiently high that there is little to no gate modulation of Ids. This common characteristic can be used as a screen for such unreliable cells during testing.

Figure 1:
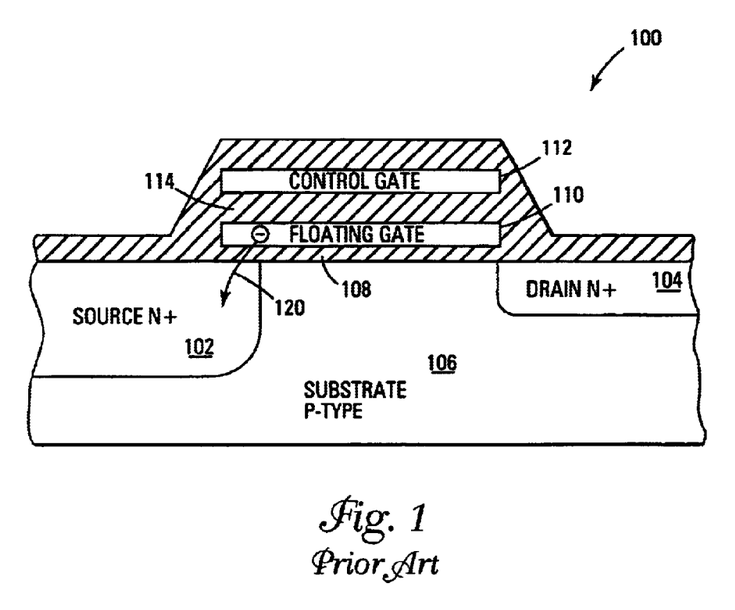
FIG. 1 is a cross-sectional view of a floating-gate memory device that utilizes tunneling of electrons through a thin gate oxide during erasing operations.

With reference to FIG. 1, a cross-sectional view is provided of a prior art floating gate memory cell 100, which is both electrically programmable and electrically erasable. The memory cell is typically referred to as a flash EPROM. The cell includes source and drain regions 102 and 104, respectively, formed in a p-type silicon substrate 106. The separation between source and drain regions define a channel over which a tunnel oxide 108 is provided. Directly above the oxide is a floating gate 110 and a control gate 112. Control gate 112 is insulated from floating gate 108 by an insulating layer 114 that normally comprises silicon dioxide or a nitrite oxide composite. Both control gate 110 and floating gate 108 are usually formed of polycrystalline silicon (i.e., polysilicon).

The floating gate memory cell may be erased (i.e., charge is removed from floating gate 108) by Fowler-Nordheim tunneling of electrons from floating gate 108 to source region 102. This is depicted in FIG. 1 by arrow 120. Fowler-Nordheim tunneling of electrons may also be utilized by certain types of floating gate memory cells during programming. Submicroscopic defects present in oxide 108 can result in early endurance failures in floating gate devices. This phenomenon may result in a change in the program and/or erase characteristics of the cell.

FIG. 2 illustrates drain current and drain voltage plots of a normal floating gate memory cell and a defective memory cell. Note that the drain currents for the normal cell, at a given drain voltage, is substantially greater than the drain currents of the defective cell. Also note that the defective cell has little to no drain current at low drain voltages. Embodiments of the present invention allow for detection of the defective cells.

Figure 3A:
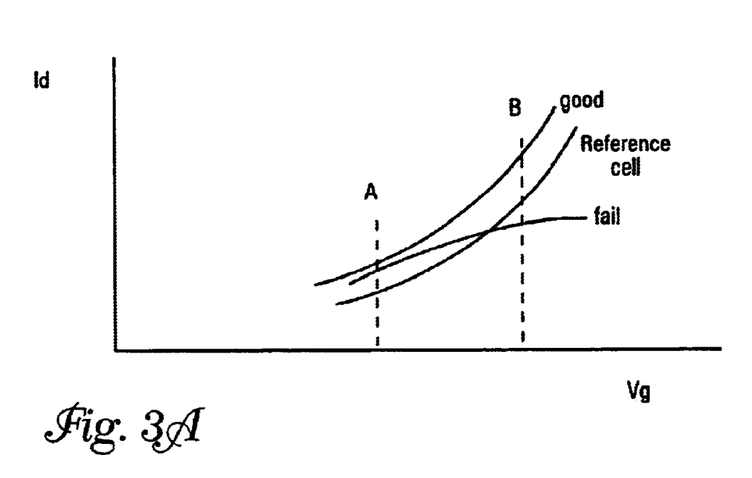
FIGS. 3A and 3B illustrate drain current as a function of gate voltages for normal memory cells and cells with high transconductance.
Figure 3B:
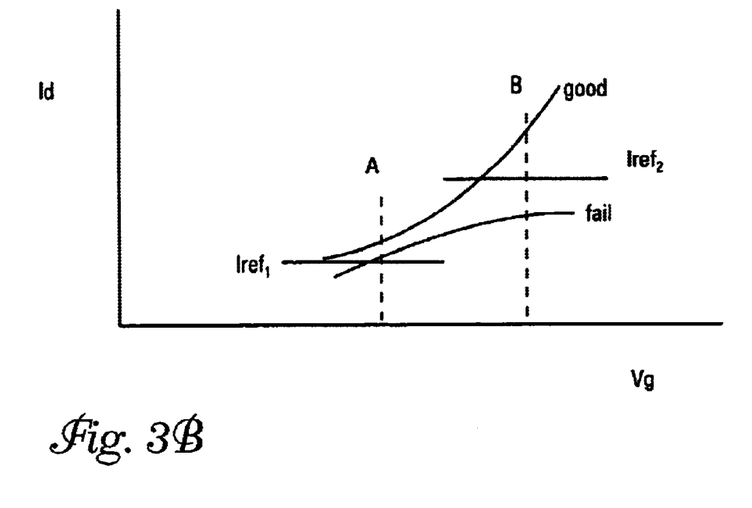

FIGS. 3A and 3B illustrate drain current plots for normal and defective memory cells. FIG. 3A shows a reference current that tracks the normal (good) cell. As such, the good memory cell always conducts more current than the reference cell. As the gate voltage of the defective cell (fail) increases, the drain current rises at a rate slower than in the normal cell. This is caused by the transconductance difference between the good and defective cells. As such, the drain current of the defective cell becomes lower than the reference current. This differential with the reference current is used to screen defective cells. FIG. 3B illustrates the good and fail cell currents, but uses two externally provided reference currents, $Iref_1$ and $Iref_2$. Two embodiments for providing the reference currents are described below.

In one embodiment, the method consists of testing memory cells in a low Vt or erased state using a nominal drain voltage (e.g. Vds=0.5–2.5 V), an elevated gate voltage (e.g. Vgs=2–12 V verses a nominal Vgs=0–7 V) and comparing the cells to an elevated reference current (e.g. 10–200 $\mu$A verses a nominal 1–100 $\mu$A). As can be seen in the chart of FIG. 2, normal cells have sufficient transconductance to achieve sufficient drain-source current, Ids, levels to pass this test condition. Abnormal cells can never attain high enough Ids levels to pass the elevated reference current comparison. Note that during normal erase verify reads (A), the defective cell reads as a good cell (above reference current).

Figure 4:
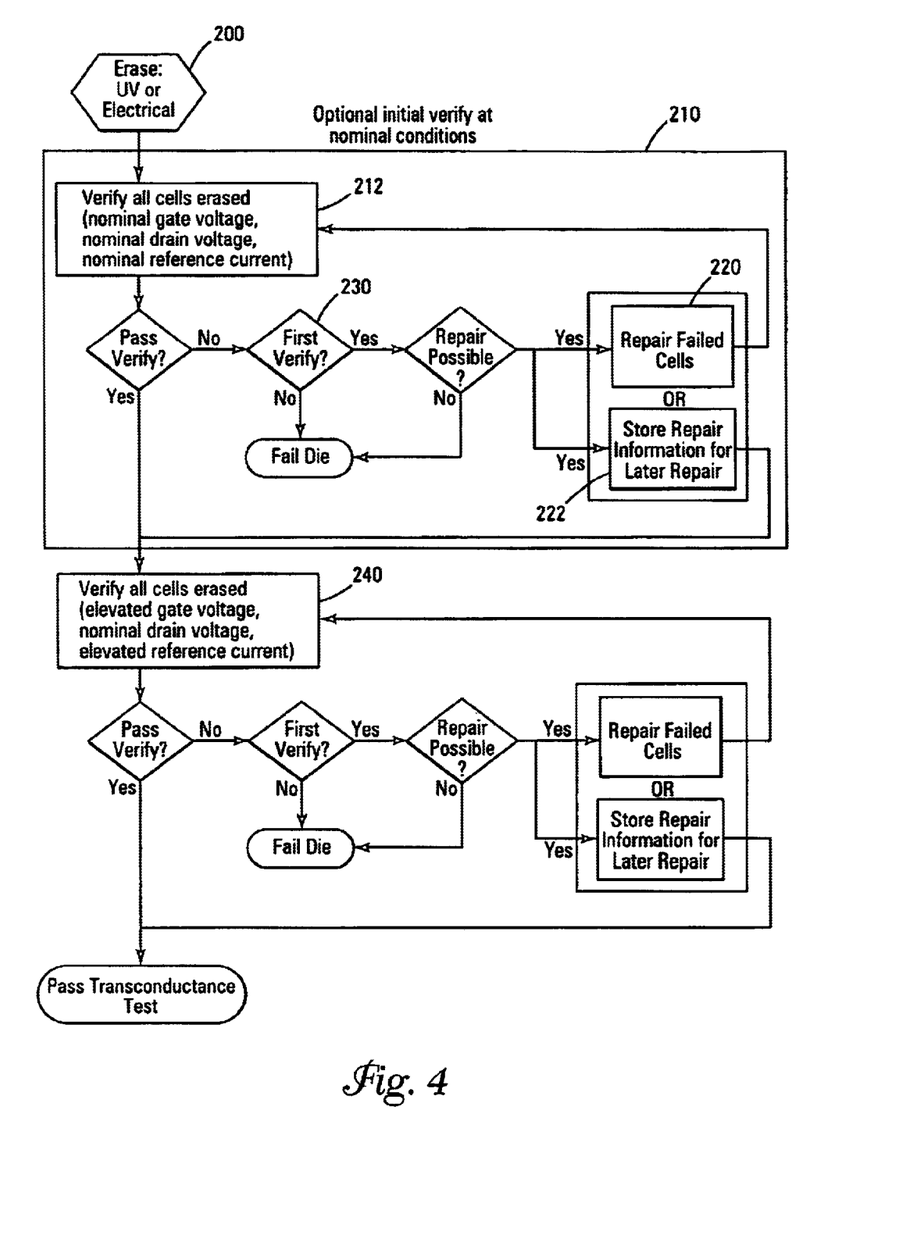
FIG. 4 is a flow chart of one embodiment of the present invention.

Referring to FIG. 4, a flow chart of one embodiment of the present invention is described. The method begins by erasing the memory cells 200. This erase can be performed using any known technique, such as electrical or ultra-violet (UV) erasure. An optional verification 210 can be performed using nominal conditions, prior to implementing the transconductance test. The optional verification test comprises verifying 212 that each memory cell is erased by applying nominal gate and drain voltages. The memory cell current is then compared to a reference current. Table 1 illustrates ranges for the normal read voltages used in this verification. The drain current, Ids, ranges will depend upon the applied drain and gate voltages. For example, at 0.5 V drain and 0.1 V gate, the Ids current is about 1 $\mu$A. Likewise, at 2.5 V drain and 7.0 V gate, the Ids current is about 100 $\mu$A. An example memory may use about 0.8 V drain and about 4.0 V gate to provide an Ids greater than about 40 $\mu$A. If the drain current is below the reference current, the verify is failed. On the first detection of a defective cell, the cell can be either repaired 220 or identified for future repair 222. If the cell is repaired, it is re-tested and a second failure 230 will result in a rejected memory die.

After the optional nominal verify is performed, a screening verification test of one embodiment is performed. This screening test comprises verifying that each memory cell is erased by an applying an elevated gate voltage and a nominal drain voltage. The memory cell current is then compared to a higher reference current. Table 1 illustrates ranges for the screening operation. The elevated gate current refers to the voltage limits compared to nominal. That is, the elevated gate voltage range begins at about 2.0 volts and ends at about 12.0 volts. The corresponding Ids range, therefore, is also increased to 10 $\mu$A to 200 $\mu$A. An example screen may use about 0.8 V drain and about 7.0 V gate to provide an Ids greater than about 60 $\mu$A. When a verification failure is identified, a determination is made regarding possible repairs, in a manner similar to the optional nominal verify described above.

TABLE 1

| Operation | Drain Voltage | Source Voltage | Gate Voltage | Ids Limit |
| --- | --- | --- | --- | --- |
| Normal Read | 0.5 V–2.5 V | 0 V | 0 V–7.0 V | 1 $\mu$A–100 $\mu$A |
| Screening Method 1 | 0.5 V–2.5 V | 0 V | 2.0 V–12.0 V | 10 $\mu$A–200 $\mu$A |

An alternative embodiment includes testing memory cells again in a low Vt or erased state using a reduced drain voltage (e.g. Vds=0.1–1.0 V verses a nominal Vds=0.5–2.5 V) and nominal (e.g. Vgs=0–7 V) or elevated (e.g. Vgs= 2–12 V) gate voltage while comparing the cells to a nominal reference current (e.g. 1–100 $\mu$A). Again, the abnormal cells can never attain high enough Ids levels to pass the reference current comparison.

Figure 5:
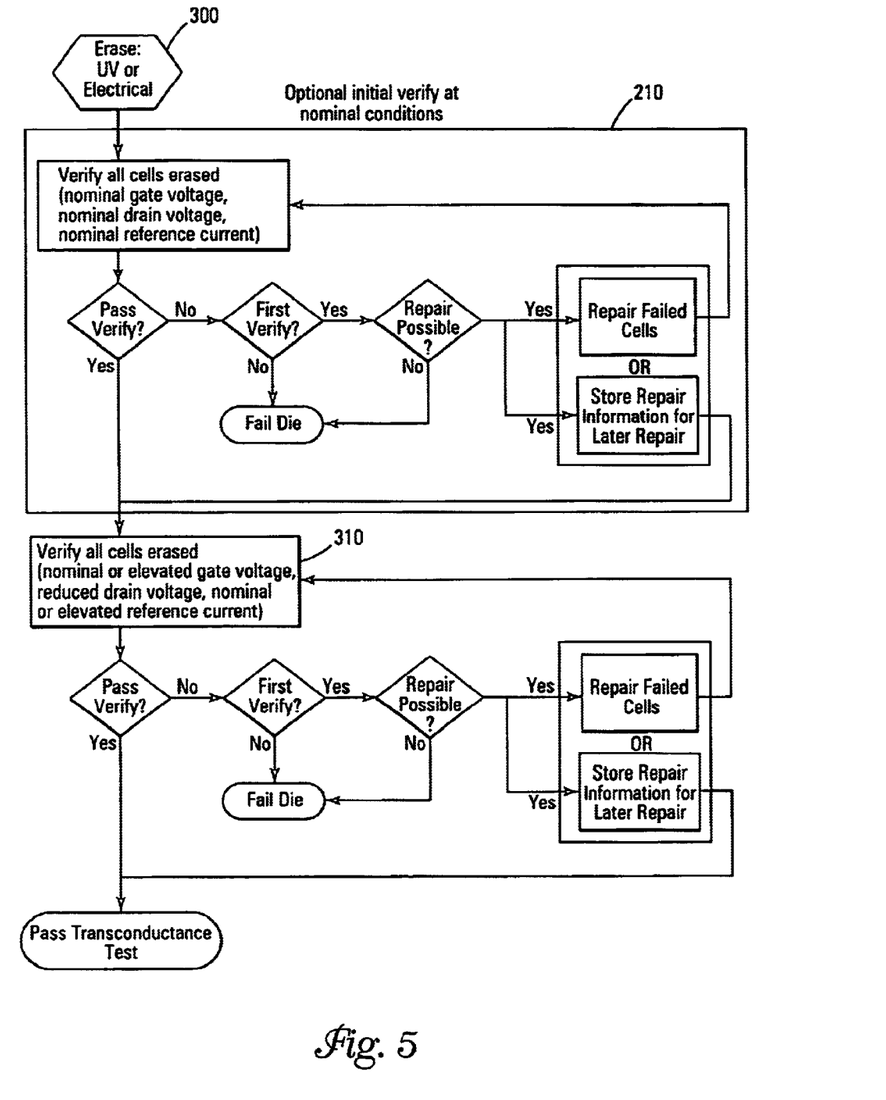
FIG. 5 is a flow chart of another embodiment of the present invention.

Referring to FIG. 5, a flow chart of another embodiment of the present invention is described. The method begins by erasing the memory cells 300. This erase can be performed using any known technique, such as electrical or ultra-violet (UV) erasure. An optional verification 210 (explained above) can be performed using nominal conditions, prior to implementing the transconductance test. The optional verification test comprises verifying that each memory cell is erased by applying nominal gate and drain voltages. The memory cell current is then compared to a reference current. Table 2 illustrates ranges for the normal read voltages used in this verification, as explained above.

After the optional nominal verify is performed, a screening verification test 310 of one embodiment is performed. This screening test comprises verifying that each memory cell is erased by an applying a nominal or elevated gate voltage and a reduced drain voltage. The memory cell current is then compared to a nominal reference current. Table 2 illustrates ranges for the screening operation. The nominal or elevated gate current refers to the voltage limits compared to nominal. That is, the gate voltage range begins at about a nominal lower voltage of 0.0 volts and ends at an elevated 12.0 volts. The corresponding Ids range, therefore, remains nominal at 1 $\mu$A to 100 $\mu$A. An example screen may use about 0.5 V drain and about 4.0 V gate to provide an Ids greater than about 40 $\mu$A. When a verification failure is identified, a determination is made regarding possible repairs, in a manner similar to the optional nominal verify described above.

TABLE 2

| Operation | Drain Voltage | Source Voltage | Gate Voltage | Ids Limit |
|---|---|---|---|---|
| Normal Read | 0.5 V–2.5 V | 0 V | 0 V–7.0 V | 1 $\mu$A–100 $\mu$A |
| Screening Method 2 | 0.1 V–1.0 V | 0 V | 0 V–12.0 V | 1 $\mu$A–100 $\mu$A |

Figure 6:
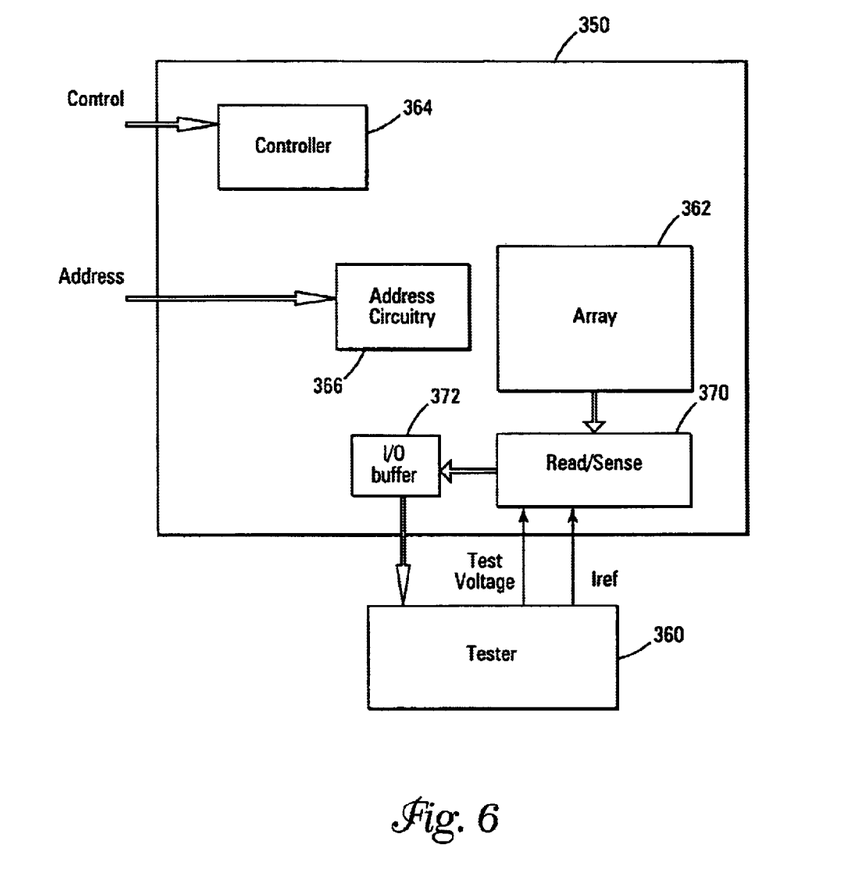
FIG. 6 is a block diagram of a test system of an embodiment of the present invention.

A block diagram of a memory device 350 coupled to a tester 360 is illustrated in FIG. 6. The memory includes an array of non-volatile memory cells 362. A controller 364 is provided in the memory to control normal memory operations, as well as perform internal tests in response to external control signals. Address circuitry 366 is used to access the memory cells of the array. A read/sense circuit 370 as well as I/O circuitry 372 are provided to read the memory cells and provide data output. Those skilled in the art will appreciate that the block diagram of FIG. 6 has been simplified to allow an understanding of the present invention, and is not intended to describe all of the features and circuitry of a memory device. The read/sense circuitry in one embodiment includes sense amplifier circuits that compare a bit line current to a reference current. During read operations a memory array cell is coupled to a bit line and activated with a wordline voltage signal. Depending on a program state of the memory cell, a bit line current is developed through the memory cell, Id. The reference current is typically generated by activating a reference flash memory cell that has been programmed to conduct a predetermined current in response to a gate voltage signal. By increasing the reference cell gate voltage, the reference current is increased.

Referring again to FIG. 3A, normal read operations performed during erase testing is performed using a reference cell gate voltage of A. Memory cells with high and low transconductance will be read as erased (conducts more current than reference current). During testing to screen out low transconductance memory cells, the gate voltages for the reference cell is increased to B. Likewise, the gate voltages to the memory array cells are increased. Good memory cells will increase Id above the reference current, even without an increase in the drain voltage. The defective cells, however, cannot produce enough drain current without an increase in the drain voltage to remain above the reference current. This embodiment, therefore, allows the reference circuit to be switched between reference currents while the memory array wordline voltages are also increased.

Referring again to FIG. 3B, an alternate embodiment of the present invention allows an externally provided reference current, Iref, to be coupled to the read/sense circuit. That is, a switch circuit allows the reference current to be routed from a tester to the sense circuit. This tester can be coupled to the memory device during a probe test of the memory die. During testing, a first reference current Iref$_1$ is used to perform an erase verify at nominal settings. To screen for defective cells, the reference current is increased to Iref$_2$ and the array wordline voltage level is increased in response to an external test voltage. Again, the memory cells with low transconductance will conduct less drain current than the reference current.

The above-described embodiments change both the reference current level and the array wordline (gate) voltage to screen out low transconductance cells. An alternate embodiment, keeps the reference current constant but decreases the array drain voltage, and optionally increases the array wordline voltages. This embodiment may be more difficult to implement. That is, reducing the drain voltage to the array may require more circuit changes.

Conclusion

The present invention provides a screen for abnormal cells using the cell transconductance. The memory cells are biased in a manner that highlights low transconductance cells. In one embodiment, a method involves reading cells against an elevated reference current while applying an elevated gate voltage, or alternatively, reading all cells against a standard reference current while applying a nominal or elevated gate voltage, and a reduced drain voltage. The abnormal cells fail this test while normal cells pass.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of testing a non-volatile floating gate memory cell comprising:
   placing the memory cell in a low threshold voltage, Vt, state;
   applying a normal read level drain voltage to a drain of the memory cell;
   applying an elevated gate voltage to a control gate of the memory cell; and
   comparing a drain current of the memory cell to a reference drain current, wherein the memory cell is determined to be defective if the drain current is below the reference current.

2. The method of claim 1 wherein the elevated gate voltage is in the range of 2 to 12 Volts.

3. The method of claim 1 wherein the normal read level drain voltage is in the range of about 0.5 to 2.5 Volt.

4. The method of claim 1 wherein the reference drain current is in the range of 10 $\mu$A to 200 $\mu$A.

5. The method of claim 1 wherein the elevated gate voltage is about 7, the normal read level drain voltage is about 0.8 and the reference drain current is about 60 $\mu$A.

6. A method of testing a non-volatile floating gate memory cell comprising:
   placing the memory cell in a low threshold voltage, Vt, state;
   applying a reduced drain voltage to a drain of the memory cell;
   applying a nominal or elevated gate voltage to a control gate of the memory cell; and
   comparing a drain current of the memory cell to a reference drain current, wherein the memory cell is determined to be defective if the drain current is below the reference current.

7. The method of claim 6 wherein the gate voltage is in the range of 0 to 12 Volts.

8. The method of claim 6 wherein the normal read level drain voltage is in the range of about 0.1 to 1.0 Volt.

9. The method of claim 6 wherein the reference drain current is in the range of 1 μA to 100 μA.

10. The method of claim 6 wherein the gate voltage is about 4, the reduced drain voltage is about 0.5, and the reference drain current is about 40 μA.

11. A method of testing a non-volatile floating gate memory cell comprising:

placing the memory cell in a low threshold voltage, Vt, state;

applying a drain voltage in the range of 0.5 to 2.5 volts to a drain of the memory cell;

applying a gate voltage in the range of 2.0 to 12 volts to a control gate of the memory cell; and comparing a drain current of the memory cell to a reference drain current in the range of 10 μA to 200 μA, wherein the memory cell is determined to be defective if the drain current is below the reference current.

12. A method of testing a non-volatile floating gate memory cell comprising:

placing the memory cell in a low threshold voltage, Vt, state;

applying a drain voltage of about 0.8 volts to a drain of the memory cell;

applying a gate voltage of about 7 volts to a control gate of the memory cell; and comparing a drain current of the memory cell to a reference drain current of about 60 μA, wherein the memory cell is determined to be defective if the drain current is below the reference current.

13. A method of testing a non-volatile floating gate memory cell comprising:

placing the memory cell in a low threshold voltage, Vt, state;

applying a drain voltage in the range of 0.1 to 1.0 volts to a drain of the memory cell;

applying a gate voltage in the range of 0.0 to 12 volts to a control gate of the memory cell; and comparing a drain current of the memory cell to a reference drain current in the range of 1 μA to 100 μA, wherein the memory cell is determined to be defective if the drain current is below the reference current.

14. A method of testing a non-volatile floating gate memory cell comprising:

placing the memory cell in a low threshold voltage, Vt, state;

applying a drain voltage of about 0.5 volts to a drain of the memory cell;

applying a gate voltage of about 4 volts to a control gate of the memory cell; and comparing a drain current of the memory cell to a reference drain current of about 40 μA, wherein the memory cell is determined to be defective if the drain current is below the reference current.

15. A method of screening abnormal flash memory cells comprising:

evaluating a transconductance of a memory cell; and comparing the evaluated transconductance to a reference transconductance level.

16. The method of claim 15 wherein evaluating the transconductance comprises:

erasing the memory cell;

applying a drain voltage of about 0.8 volts to a drain of the memory cell; and applying a gate voltage of about 7 volts to a control gate of the memory cell.

17. The method of claim 16 wherein comparing the evaluated transconductance comprises comparing a drain current of the memory cell to a reference drain current of about 60 μA.

18. A method of screening abnormal flash memory cells comprising:

evaluating a transconductance of a memory cell;

comparing the evaluated transconductance to a reference transconductance level;

erasing the memory cell;

reading the memory cell using an elevated reference current while applying an elevated gate voltage.

19. A method of screening abnormal flash memory cells comprising:

evaluating a transconductance of a memory cell; and comparing the evaluated transconductance to a reference transconductance level;

erasing the memory cell;

reading the memory cell using a standard reference current while applying a nominal or elevated gate voltage, and a reduced drain voltage.

20. A method of testing a flash memory comprising:

reading erased memory cells using a first reference current;

increasing a gate voltage coupled to the erased memory cells;

reading the erased memory cells having an increased gate voltage using a second reference current, where the second reference current is greater than the first reference current; and identifying memory cells as defective if the erased memory cell is read as being programmed while using the second reference current.

21. The method of claim 20 wherein the second reference current is externally provided during a test operation.

22. The method of claim 20 wherein the first and second reference currents are generated using a reference flash cell in response to first and second gate voltages.

23. A method of testing a flash memory comprising:

coupling a first drain voltage to erased memory cells;

reading the erased memory cells by comparing a bit line current to a reference current;

coupling a second drain voltage that is less than the first drain voltage to the erased memory cells;

reading the erased memory cells by comparing the bit line current to the reference current; and identifying memory cells as defective if the drain current is less than the reference current while using the second drain voltage.

* * * * *